United States Patent
Lee et al.

(10) Patent No.: US 10,453,530 B2
(45) Date of Patent: Oct. 22, 2019

(54) RDMA-SSD DUAL-PORT UNIFIED MEMORY AND NETWORK CONTROLLER

(71) Applicant: Futurewei Technologies, Inc., Plano, TX (US)

(72) Inventors: Xiaobing Lee, Santa Clara, CA (US); Michael Young, San Jose, CA (US); Ting Li, Hangzhou (CN); Yansong Wang, Hangzhou (CN); Yong Chen, Redmond, CA (US)

(73) Assignee: Futurewei Technologies, Inc., Plano, TX (US)

( * ) Notice: Subject to any disclaimer, the term of this patent is extended or adjusted under 35 U.S.C. 154(b) by 406 days.

(21) Appl. No.: 14/644,021

(22) Filed: Mar. 10, 2015

(65) Prior Publication Data

US 2015/0254003 A1    Sep. 10, 2015

Related U.S. Application Data

(60) Provisional application No. 61/950,660, filed on Mar. 10, 2014.

(51) Int. Cl.
*G06F 3/06* (2006.01)
*G11C 14/00* (2006.01)
(Continued)

(52) U.S. Cl.
CPC ...... *G11C 14/0045* (2013.01); *G06F 12/0246* (2013.01); *G06F 12/0868* (2013.01);
(Continued)

(58) Field of Classification Search
CPC .............. G06F 15/167; G06F 3/0688; G06F 2212/1016; G06F 2212/205; G06F 3/038;
(Continued)

(56) References Cited

U.S. PATENT DOCUMENTS

| | | | | |
|---|---|---|---|---|
| 4,622,633 A | * | 11/1986 | Ceccon | G06F 9/4401 709/220 |
| 5,754,764 A | * | 5/1998 | Davis | G06F 13/385 709/200 |

(Continued)

*Primary Examiner* — Adam M Queler
*Assistant Examiner* — Alex G Olson
(74) *Attorney, Agent, or Firm* — Schwegman Lundberg & Woessner, P.A.

(57) ABSTRACT

System and method for a unified memory and network controller for an all-flash array (AFA) storage blade in a distributed flash storage clusters over a fabric network. The unified memory and network controller has 3-way control functions including unified memory buses to cache memories and DDR4-AFA controllers, a dual-port PCIE interconnection to two host processors of gateway clusters, and four switch fabric ports for interconnections with peer controllers (e.g., AFA blades and/or chassis) in the distributed flash storage network. The AFA storage blade includes dynamic random-access memory (DRAM) and magnetoresistive random-access memory (MRAM) configured as data read/write cache buffers, and flash memory DIMM devices as primary storage. Remote data memory access (RDMA) for clients via the data caching buffers is enabled and controlled by the host processor interconnection(s), the switch fabric ports, and a unified memory bus from the unified controller to the data buffer and the flash SSDs.

22 Claims, 7 Drawing Sheets

(51) Int. Cl.
| | |
|---|---|
| *G06F 13/38* | (2006.01) |
| *G06F 13/40* | (2006.01) |
| *H04L 29/08* | (2006.01) |
| *G06F 12/02* | (2006.01) |
| *G06F 12/0868* | (2016.01) |
| *G11C 13/00* | (2006.01) |

(52) U.S. Cl.
CPC ........ *G06F 13/382* (2013.01); *G06F 13/4009* (2013.01); *G11C 14/0018* (2013.01); *H04L 67/1097* (2013.01); *G06F 2212/1024* (2013.01); *G06F 2212/174* (2013.01); *G06F 2212/263* (2013.01); *G06F 2212/7208* (2013.01); *G11C 13/0002* (2013.01)

(58) Field of Classification Search
CPC ........... G06F 2213/0026; G06F 3/0679; G11C 7/1072; G11C 14/0036; G11C 13/0002
See application file for complete search history.

(56) References Cited

U.S. PATENT DOCUMENTS

| | | | | |
|---|---|---|---|---|
| 6,948,050 B1* | 9/2005 | Gove | ................... | G06F 9/3851 712/35 |
| 9,229,854 B1* | 1/2016 | Kuzmin | ................. | G06F 8/654 |
| 2004/0221102 A1* | 11/2004 | Watanabe | ............ | G06F 3/0611 711/112 |
| 2006/0136570 A1* | 6/2006 | Pandya | .................. | H04L 63/20 709/217 |
| 2008/0005614 A1* | 1/2008 | Lubbers | .............. | G06F 11/2092 714/11 |
| 2008/0158818 A1* | 7/2008 | Clidaras | ................. | G06F 1/206 361/699 |
| 2009/0259882 A1* | 10/2009 | Shellhamer | ......... | G06F 11/1076 714/6.32 |
| 2011/0082970 A1* | 4/2011 | Rohleder | ............ | G06F 11/1666 711/104 |
| 2013/0086311 A1* | 4/2013 | Huang | ................ | G06F 13/1689 711/103 |
| 2013/0198312 A1* | 8/2013 | Tamir | .................... | G06F 15/167 709/212 |
| 2014/0013047 A1* | 1/2014 | Sawin | ................. | G06F 12/0862 711/113 |
| 2014/0108703 A1* | 4/2014 | Cohen | ................... | G06F 3/0616 711/103 |
| 2014/0149637 A1* | 5/2014 | Gu | .......................... | G06F 13/28 711/103 |
| 2014/0177629 A1* | 6/2014 | Manula | ................. | H04L 49/201 370/390 |
| 2014/0244936 A1* | 8/2014 | Maharana | ........... | G06F 12/0815 711/135 |
| 2014/0304464 A1* | 10/2014 | Bert | ...................... | G06F 3/0641 711/105 |
| 2014/0317336 A1* | 10/2014 | Fitch | ..................... | G06F 12/109 711/103 |
| 2015/0134877 A1* | 5/2015 | Moon | ................. | G06F 12/0871 711/103 |
| 2015/0161048 A1* | 6/2015 | Patil | ...................... | G06F 16/172 711/141 |
| 2015/0248366 A1* | 9/2015 | Bergsten | ............. | H04L 67/1097 710/308 |

* cited by examiner

RDMA-SSD DUAL-PORT UNIFIED MEMORY AND NETWORK CONTROLLER

CROSS-REFERENCE TO RELATED APPLICATIONS

This application claims priority from U.S. Provisional Patent Application Ser. No. 61/950,660, filed Mar. 10, 2014 to Lee et al., entitled "RDMA-SSD CLUSTERS ON-BLADES & DDR4-SSD HD-DIMM PRIMARY STORAGES,"the benefit of the earlier filing date of which is hereby claimed under 35 U.S.C. § 119(e) and the contents of which are further incorporated by reference in their entirety.

FIELD OF THE INVENTION

The present disclosure pertains to network storage systems, and more particularly, to the use of remote direct memory access (RDMA) to access dynamic random access cache buffers and non-volatile solid-state memory in a network storage system of distributed all flash array (D-AFA).

BACKGROUND OF THE INVENTION

A storage server is a type of network storage controller which is a special purpose data processing system used to store and retrieve data on behalf of one or more clients on a network. A storage server operates on behalf of one or more clients to store and manage data in a set of mass storage devices, such as magnetic or optical storage-based disks or tapes. In conventional network storage systems, the mass storage devices may be organized into one or more groups of drives (e.g., redundant array of inexpensive disks (RAID)). A storage server also typically includes internal memory that is used as a buffer cache, to speed up the reading and writing of data from and to (respectively) the main mass storage system.

It is desirable to improve the performance of any data processing system. In the case of a storage server, one way to accomplish this is by reducing the latency and increasing the random access throughput associated with accessing the storage server's main mass storage subsystem. In this regard, flash memory, particularly NAND flash memory, has certain very desirable properties. Flash memory generally has a very fast read access speed compared to that of conventional hard disk drives.

However, conventional approaches to using flash memory in SATA/SAS-SSD, PCIE-SSD and/or NVME-SSD form-factors all have certain characteristics related to treatment as periphery devices that make their use in enterprise storage systems problematic. In particular, a conventional flash memory device is typically accessed by a host periphery port through a serial command/data interface with low priority to use memory that becomes a bottleneck in applications where low latency and/or high throughput are needed. Those serial interfaces usually need high power consumption and generate substantial heat, even as the attached periphery devices in idle states.

In addition, while flash memory generally has superior read performance compared to conventional hard disk drives, its write latency can be 16 times longer than its read time. Furthermore, flash memory tends to wear out after a finite number of erase operations.

SUMMARY OF THE INVENTION

A storage network architecture including remote direct memory access-solid state drive (RDMA-SSD) clusters on a blade, having cross-over connections linking multiple RDMA-SSD blades and/or chassis for high-density storage capacity, low latency, high input/output operations per second (IOPs), high reliability and high availability, and on-demand caching resource management. Embodiments provide straightforward RDMA-device access to the cache buffers and DDR4-SSD DIMM clusters from remote client host processors and virtual machines, based on slave-memory virtualization of data buffers (e.g., DDR4-DRAMs) and DDR4-SSD DIMMs clusters on the blades and chassis across the fabric network. Low-latency zero-copy network data transfers are enabled by distributed RDMA-engines at each blade under the gateway controls, without the gateway host memory hopping necessary in conventional SSD-storage server solutions.

According to aspects of the present disclosure, a system and method are provided for a unified memory and network controller for an all-flash array (AFA) storage blade in a distributed flash storage clusters over a fabric network. The unified memory and network controller has 3-way control functions including unified memory buses to cache memories and DDR4-AFA controllers, a dual-port PCIE interconnection to two host processors of gateway clusters, and four switch fabric ports for interconnections with peer controllers (e.g., AFA blades and/or chassis) in the distributed flash storage network. The AFA storage blade includes dynamic random-access memory (DRAM) and magnetoresistive random-access memory (MRAM) configured as data read/write cache buffers, and flash memory DIMM devices as primary storage. Remote data memory access (RDMA) for clients via the data caching buffers is enabled and controlled by the host processor interconnection(s), the switch fabric ports, and a unified memory bus from the unified controller to the data buffer and the flash SSDs.

In one aspect of the present disclosure, a non-volatile memory express (NVME) controller includes a host interface, a dual port fabric port, a unified memory interface, a memory cache, and a processor communicatively coupled with the host interface, the dual port fabric port, the unified memory interface and the memory cache. The processor is configured to store data in the memory cache in response to a data request received at one of the host interface and the dual port fabric port, and to determine a non-volatile storage module of an all-flash array (AFA) in communication with the unified memory interface and associated with the data request.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying drawing figures in which like reference characters designate like elements and in which.

DETAILED DESCRIPTION OF THE INVENTION

Figure 1:
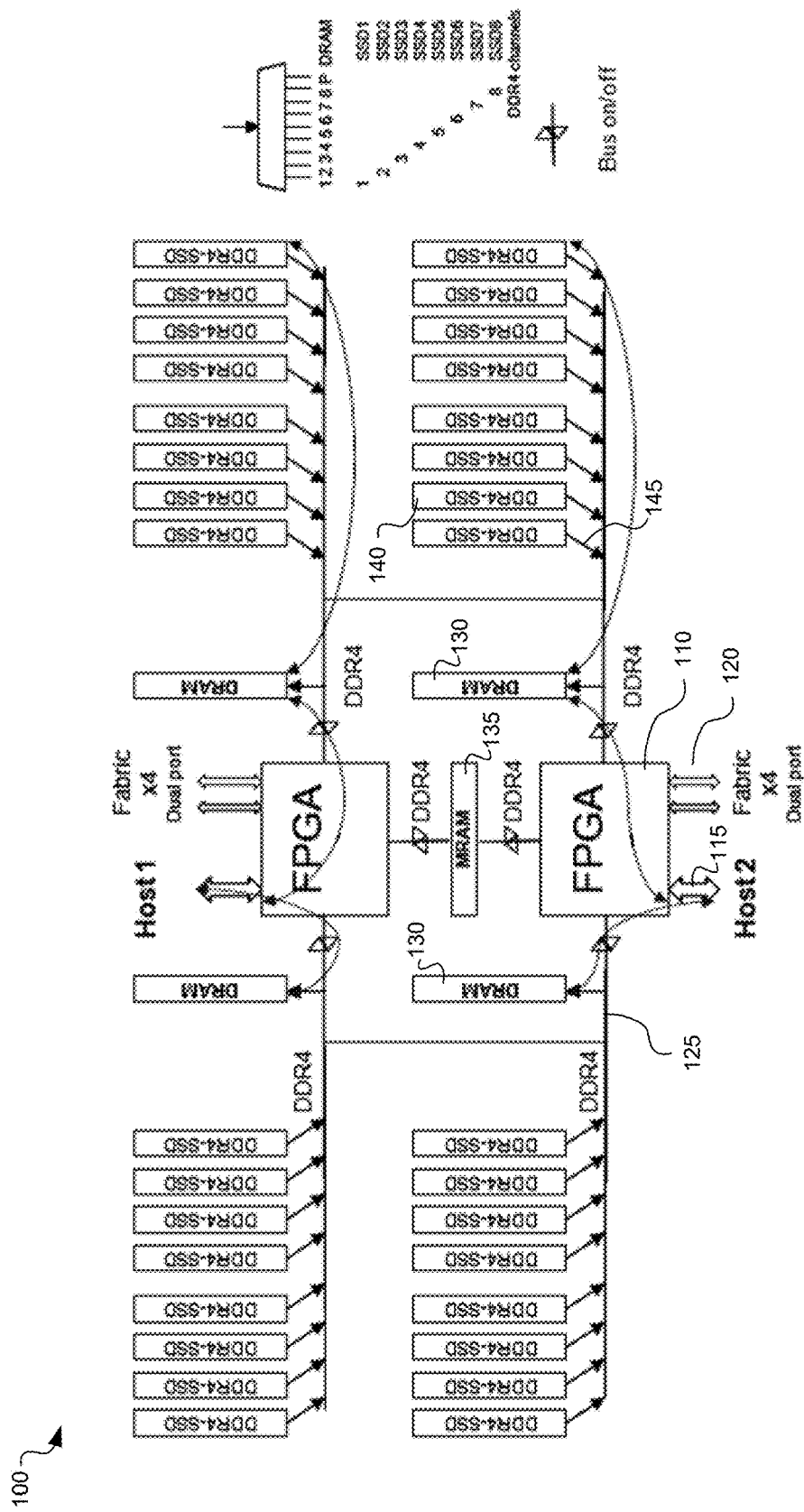
FIG. 1 is a schematic illustration of a network storage node architecture of distributed AFA blade, in accordance with an embodiment of the present disclosure.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer generated step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present claimed subject matter, discussions utilizing terms such as "storing," "creating," "protecting," "receiving," "encrypting," "decrypting," "destroying," or the like, refer to the action and processes of a computer system or integrated circuit, or similar electronic computing device, including an embedded system, that manipulates and transforms data represented as physical (electronic) quantities within the computer system's registers and memories into other data similarly represented as physical quantities within the computer system memories or registers or other such information storage, transmission or display devices.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Referring now to FIG. 1, a network storage node 100 is depicted according to an exemplary embodiment of the present disclosure. The network storage node 100 includes a processing unit 110, for example an ARM64 central processing unit or a field programmable gate array (FPGA). The processing unit 110 includes port 115 (e.g., PCIe 3.0 ×8 ports) providing interconnections with external host processors (e.g., gateway clusters), for example host processors of network servers external to the network storage node 100. The processing unit 110 includes fabric ports 120 (e.g., four ×4 serializer/deserializer (SerDes) ports), configured for clustering multiple RDMA-SSD blades. The network storage node 100 includes unified memory bus 125 (e.g., 64 bit DDR4-DRAM bus), DRAM 130, MRAM 135, and ports 145 (e.g., DDR4-8 bit channels) for primary non-volatile storage module 140 (e.g., DDR4-SSD). According to an embodiment, the processing unit 110, host interconnect port 115, fabric ports 120, DRAM 130, and the MRAM 135 together form a non-volatile memory express (NVME) controller. According to an embodiment, DDR4-AFA primary storage is embodied by DDR4-SSD DIMM clusters. Command and data streams to the DDR4-SDD are able to use DDR4 bus fan-out to more ONFI-NVDDR2 flash chips, with low-cost, high-density DDR4-SSD DIMM devices and DDR4-to-ONFI bus adapters. According to an embodiment of the present disclosure, unified memory bus 125 includes two (2) bus traces (not shown). According to an embodiment, DRAM 130 may be on a separate bus from MRAM 135 and DDR4-SSD primary storage bus 125 for more DRAM capacity and bandwidth as needed.

According to an embodiment of the present disclosure, network storage node 100 is embodied by a board for deployment in a blade server configuration, and includes two (2) ARM64 or FPGA processing units 110 per board. The two processing units 110 are able to provide connections with two (2) external host processors (e.g., gateway) via ports 115, and peer devices via switch fabric ports 120. According to an embodiment, the switch fabric may provide PCIE or Infiniband (or other) connectivity by hot-swappable fabric blades with expansion ports.

In operation, a host processor enables an application to communicate with the processing unit 110 via a bus into port 115, for example, a PCIe bus. The host processor, via processing unit 110, is able to access DRAM 130, MRAM 135, and primary storage 140 of network storage node 100. This is depicted by the double-headed arrows, and illustrates the provided RDMA functionality for the client (e.g., host processor, or peer device, remote VMs). The processing unit 110 provides a fabric connection, and a parallel bus connection. MRAM 135 is shared by the two connection paths through interleaving DDR4 data buffers. Input data from the host processor is initially stored in DRAM 130 for read caching and auto-copied to MRAM 135 for write caching, which provides a copy of the data while the data is prepared for storing in the primary storage (e.g., flash memory, which has a longer write time than the MRAM). After data is stored in the MRAM 135, the processing unit 110 commits to clients that the write is completed and then moves/secures the data to the appropriate flash memory 140. The MRAM is non-volatile, providing a low-latency means of storing a copy of the write data in case of power failure. The capacity of the MRAM 135 is preferably based upon NAND flash write-latency $\Delta_f$, as $2 \times 1.5 \times \Delta_f \times 80$ Gbps$\times$depth of write-queues. In practice, 128 MB is sufficient for two host processors accessing the network storage node 100. If a failure develops, a second path to read the unsecured data exists via the MRAM 135 and secured data via flash memory 140. In a power failure, MRAM 135 holds all the unsecured data, metadata, and unsecured FTL increments for the power-up recovery to the last states. Securing data from DRAM 130 to flash memory 140 is on the order of 1-2 ms. Flash memory 140 can be multiple, and may be cascaded, and therefore the persistence time of the data in the DRAM 130 is sufficiently long to account for worst-case write time performance to flash memory 140.

By accessing fabric ports 120, any one of the host processors is able to communicate with any connected peer devices of network storage node 100 (e.g., a parallel network storage node, not shown), and RDMA access the data stored in the primary storage of the connected peer devices. According to an embodiment of the present disclosure, each processing unit 110 is able to connect to four (4) processing units on peer devices, via four (4) fabric ports 120 by direct mesh interconnections with the lowest latency.

Blade Cluster

Figure 2:
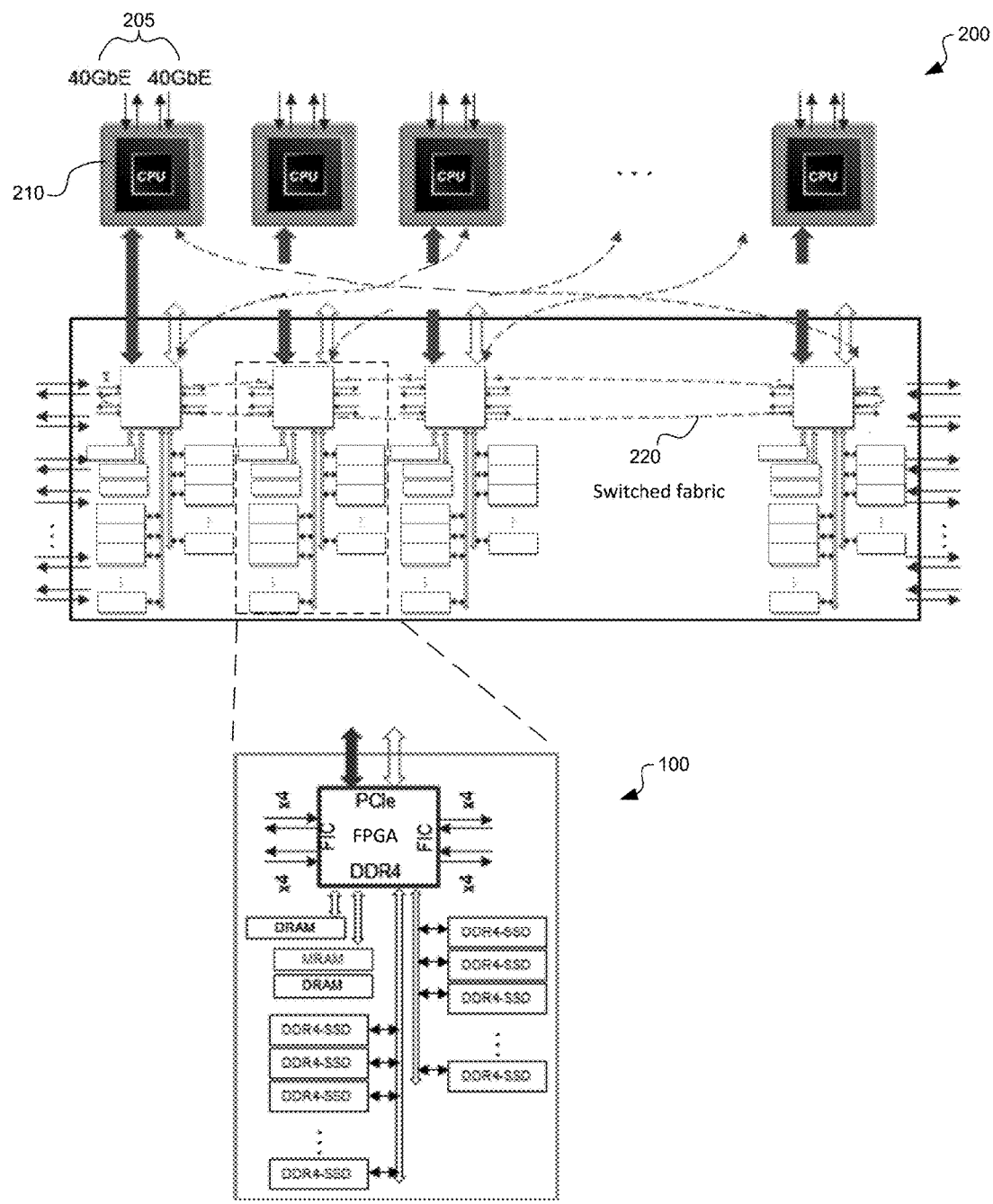
FIG. 2 is a schematic illustration depicting a network storage system including several network storage nodes, in distributed AFA clusters, in accordance with an embodiment of the present disclosure.

Referring now to FIG. 2, a network storage system 200 accessible to multiple host systems is depicted according to an exemplary embodiment. The network storage system 200 may comprise a blade on a server chassis, and can include a number of network storage nodes 100. A simplified network storage node 100 is depicted as a magnification of one of the several network storage nodes of the network storage system 200. According to an embodiment, each storage node 100 includes two processing units 110 (e.g., 2 FPGAs), each of which is connected to a host processor 210 of a host device. While only 1 processing unit 110 is depicted, in practice two are present, and both have independent control of all flash memory modules 140 of the storage node 100. The host processor 210 generally has two network connections 205 (e.g., two 40 Gb Ethernet connections) for communication between client applications and the storage network. The network storage nodes 100 are in communication with one another via a fabric interface 220. According to an embodiment, the fabric interface 220 is a switched fabric interface (e.g., PCIE or Infiniband or proprietary RDMA-fabric Data Center Networks). According to an embodiment, the fabric interface is a set of Huawei FB580x devices for scale-out clusters of storage system 200. According to an embodiment, the fabric 220 is a passive mesh of interconnections, wherein processing units 110 of individual network storage nodes 100 are connected to each other directly via fabric port 120.

Generally, an implementation of the network storage solution includes a chassis containing a number of network storage systems 200, for example, four (4) network storage systems deployed in the chassis, which provides eight (8) processors on the network storage nodes. Further, network storage solutions frequently contain redundant systems, and therefore two or more such chassis can be deployed.

Each processor (e.g., processor 110) can connect to four (4) other processors via fabric ports 120. Therefore, given 8 processors 110, each processor 110 can connect to four others directly so that five (5) are connected. The remaining three (3) can be connected indirectly (e.g., direct connection with one of the processors 110 directly connected to the first processor 110). Host devices generally have two host processors 210, and according to an embodiment of the present disclosure, each host processor 210 is connected to a processor 110 of a separate network storage node 100. That is, a first host processor 210 of a host device can be connected to a first processor 110 of a first network storage node, and a second host processor 210 of the host device can be connected to a first processor 110 of a second network storage node, for example. The dashed arrows of FIG. 2 depict these host processor 210-to-processor 110 connections, where the open double-ended arrow references a second processor 110 of network storage nodes, not shown for clarity.

Virtualization

According to embodiments of the present disclosure, the network storage system 200 can present a virtualized network storage device with large capacity and build-in fault-tolerance to client applications through multiple 40 Gb Ethernet ports, or through expansion ports of FB580x fabric networks. That is, rather than a client application having granular access to individual DDR4-DRAM cache memories 130 and DDR4-SSD primary storage modules 140 of individual network storage nodes 100, the client application is presented with an aggregate storage capacity representative of the capacity of all the network storage nodes 100 of the network storage system 200.

Further, virtualization also provides similar advantages to PCIE slave-memory, providing virtualization of all DRAMs 130, MRAMs 135, and memory modules 140 for all connected input/output devices connected via fabric ports 120. For example a 40GbE TOE chip can directly DMA-write ingress data packets into the virtual RAM (vRAM) of MRAM 135 that terminates iSCSI or fiber channel (FC or fiber channel over Ethernet, FCoE) transactions before the data is written into a particular NAND flash page, greatly enhancing the write-latency of the non-volatile memory.

According to an embodiment, each host processor 210 has two 40 Gb Ethernet or 56 Gb FC connections 205. Storage system operating software provides a unique media access control (MAC) address for each connection—therefore, in a non-limiting example of eight connected host processors 210, the network storage system includes 16 unique MAC addresses. According to an embodiment of the present disclosure, the network storage system 200 has one (shared) namespace (IP address) by which incoming communication may be established. Requests for data sent to this address can be received by any host CPU 210 of the network storage system 200, and routed to the appropriate control portion, for example to a particular FPGA 110 (based on the flash module 140—e.g., DDR4-SSD DIMM—where data is stored). While incoming data requests may be received by any host processor 210, according to embodiments of the present disclosure outgoing data is sent by the host processor 210 with PCIE port linked to the stored data (e.g., the host processor 210 directly connected via host interface 115 to the processor 110 of the storage node 100 storing the data). All host processors 210 use the same outgoing IP address, so the manifold network storage nodes 100 all look to be one machine to the client application.

The network storage system 200 runs a distributed file system application for mapping data locations in the network. For example, CEPH or Lustre can be employed as a metadata server located on several host processors 210 of the network storage system 200. Data requests are first routed to the metadata server, which determines which host processor 210 controls the data. This operation is opaque to the client application. A metadata server is located on one of the processor 110 (e.g., FPGA). The metadata server stores the locations of data across the network storage system (e.g., to which processor 110 the flash memory module 140 storing data is attached). The processor 110 running the metadata servers determines to which host processor 210 payload data belongs, and also reports to the client application the common (virtual) IP address where data is located. The assigned host processor 210 communicates with the appropriate processor 110 to locate the requested data, and once found, the data is routed from processor 110 to host processor 210, and on to the client application.

DRAM and MRAM Functionality

Each network storage node 100 has both internal and external network connections. The MRAM 135 of the network storage node 100 functions to reduce data write latency, serving as a kind of write cache and power-down protection. When a client device writes the data into network storage node 100, the primary storage module 140 (which is flash memory) is relatively slow, taking approximately 1.6 ms to write. In order to improve write speed and preserve data integrity in case of a system failure, data is initially written (by the host processor 210) through PCIE 215 or Fabric 210 to the DRAM (which can be DDR4 memory) and auto-copied to non-volatile MRAM 135, which has a write speed on the order of DDR3 write speed (e.g., write-only, by two ARM64 controllers). Dynamic-caching for multiple host processors 210 simultaneously DMA or RDMA writes of 4KB or 1MB data buffers is managed by BTL (Buffer Translation Layer) table, without the need of a memory locking mechanism, even as all hosts write data blocks to the conflict address, the RDMA-SSD controller 110 will put them into buffer-rings mapped by the BTL orderly. Then, the data will be propagated into available flash memory and mapped by FTL (Flash Translation Layer) tables. Once stored in MRAM 135, the processing unit 110 communicates to the host processor (the client) that the write data is safely stored in non-volatile memory as done. Internally, the processing unit 110 continues the data write process at the primary storage 140 (e.g., DDR4-SSD DIMM devices), where it is persistently stored.

According to an embodiment of the present disclosure, auto-mirroring of a data write through a first host processor 210 to a first processor 110 (e.g., FPGA) with an attached DRAM. This comprises a first copy of the data as read-cache that is nearly instantaneously available to clients, by BTL. At the same time data is stored to an attached MRAM as write-cache for fault-tolerance. The first processor 110 can automatically use fabric interconnection 120 to send the data to another assigned mirroring processor 110 (e.g., a second FPGA). From that second processor 110 data is written to associated DRAM (of that storage node 100), and the associated MRAM. This comprises a second copy (mirror) of the data. Preferably, the second processor 110 is located on another chassis (e.g., a redundant system). MRAM storage of the data is a guarantee for data reliability, as MRAM is non-volatile. Storing two copies on DRAM is for availability—for two different chassis systems to lose power, or to have some other failures at the same time, is a very low likelihood.

According to an embodiment, mirroring occurs after half of an initial data payload (e.g., 32 bytes of a 64 byte payload) has been written to the first MRAM. Each processor 110 writes to its associated DRAM, then its associated MRAM, and finally its associated non-volatile memory module (flash memory) 140.

Due to the write speed differences between the DRAM, MRAM, and NVM storage modules, a data write operation can develop a bandwidth issue. Therefore write bandwidth is manipulated by accumulating data in the DRAM and MRAM, and performing the write with a burst along the DDR4 bus 125 to the storage modules 140. According to embodiments of the present disclosure, the DDR4 bus 125 is an 8 byte bus, and 8 NVM storage modules 140 each have 1 byte ports. A data write operation of 8 bytes can direct 8 1-byte data packets to 8 distinct storage modules 140.

Data, once stored in DRAM, is reported to a client application (via host processor 210) as being stored in the network storage system 200. The persistence of data storage in the DRAM is configurable—a typical storage duration is 1 minute read cache, although other times are possible and can be determined based on several factors, such as the frequency with which the data is requested for access. If a client request to access the data is received within the DRAM storage time, the data is read from DRAM and not flash memory module 140, thereby improving latency. In general, a read request of data stored in memory module 140 entails movement of the data from the flash memory module 140 storing the requested data, and storage of the read request data in DRAM. A dynamic read caching management algorithm, implemented in firmware, for example, can prolong the caching period to 5 minutes for some data blocks. The caching period is configurable, and can depend upon read-frequency and ageing policies.

Failure Recovery

Failures of processors 110 (e.g., FPGAs) of network storage nodes 100 can occur during operation of a network storage solution. Generally, failures concerning processor 110 occur in two kinds. In the first, the processor 110 is still functional, but a failure has occurred in the communication of the processor 110 with the host processor 210. In the second, the processor 110 ceases to operate normally. The processor 110 state is monitored by the link with its host processor 210, and via a heartbeat with a coupled processor 110 (via port 120) If the failure is determined to be a communication failure (e.g., host interface 115 failure), communication with the processor 110 can be re-routed via one of the peer-processors 110 connected via fabric port 120.

If the failure is determined to be a processor 110 operation failure, an attempt to restore normal operation of processor 110 can be made via resetting the processor 110. At an instance of power failure, the MRAMs save all the unsecured data blocks, associated metadata and states, and the unsecured FTL increments for future recovery at power-on, as needed. For a mirrored storage system with only one chassis failure or multi-chassis storage system protected by flexible Erasure Coding redundancy with recoverable failures, power-on recovery from local MRAMs is not needed and load rebalancing among all chassis will run progressively in maintenance period.

RDMA Fabric

Figure 3:
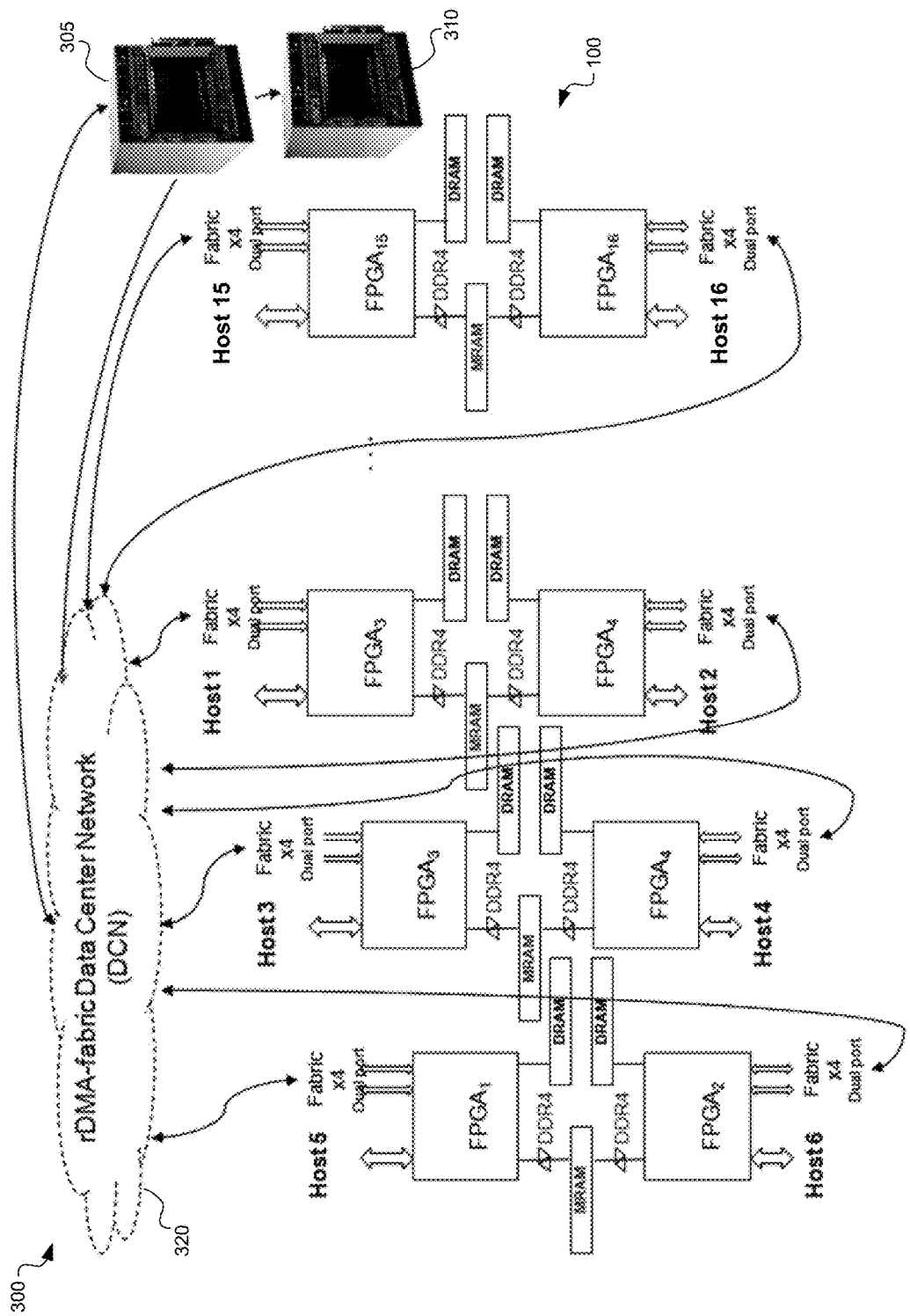
FIG. 3 is a schematic illustration depicting a remote data memory access (RDMA) fabric data center network, in accordance with an embodiment of the present disclosure.

Referring now to FIG. 3, a remote data memory access (RDMA) fabric data center network 300 having a fabric 320 is depicted in accordance with an embodiment of the present disclosure. RDMA fabric data center network 300 includes a first data server chassis 305 and a second data server chassis 310, each implementing a plurality of network storage systems 200. A number of simplified network nodes 100 are depicted in FIG. 3. Each of the data servers 305 and 310

The fabric 320 can be implemented in one of several ways. The fabric 320 can be a passive connection between processors 110 via, for example, direct connection (e.g., solder). The fabric 320 can be implemented via a flexible cable (e.g., PCIe switch, MR (multi-ruled) switch). The fabric 320 can be implemented via a Huawei FB 580x fabric.

A fabric 320 passive implementation provides simplicity, in that processors 110 are directly connected cross-paired chassis, and latency is low (ruled by burst speed of packet). Data integrity for communication between processors 110 could be via forward error correction (FEC) passing 32 bytes, for example. If an error is detected, FEC can be used to correct the data (e.g., via so-called "store-and-forward"). This approach can be used in conjunction with cyclic redundancy check (CRC) as well.

A switched fabric 320 passive implementation employing PCIE multi-root (MR) network provides a connection between each processor 110 of the network storage system 200. That is, each processor 110 of each network storage node 100 can connect to all other processors 110 (via switch). A PCIE switch (e.g., PLX 9797) requires some software for control, increasing system complexity. However, all processors 110 (e.g., FPGAs) can be connected. A similar connectivity between processors 110 can be provided by a Huawei FB580x switch, which is a 144 paired switch. For switched fabric 320 implementations (e.g., PCIE or Huawei FB580x network blades), a chassis management blade is needed in the chassis to control the switch. In contrast, the connections between processors 110 provided by a passive implementation are "baked-in." However, for more RDMA-SSD processors (that is, for aggregating more flash memory chips), e.g., 8 or even 16 network storage nodes 100, a greater number of hops between processors 110 exists, and may become unwieldy for passive mesh (e.g., direct connect).

Figure 4:
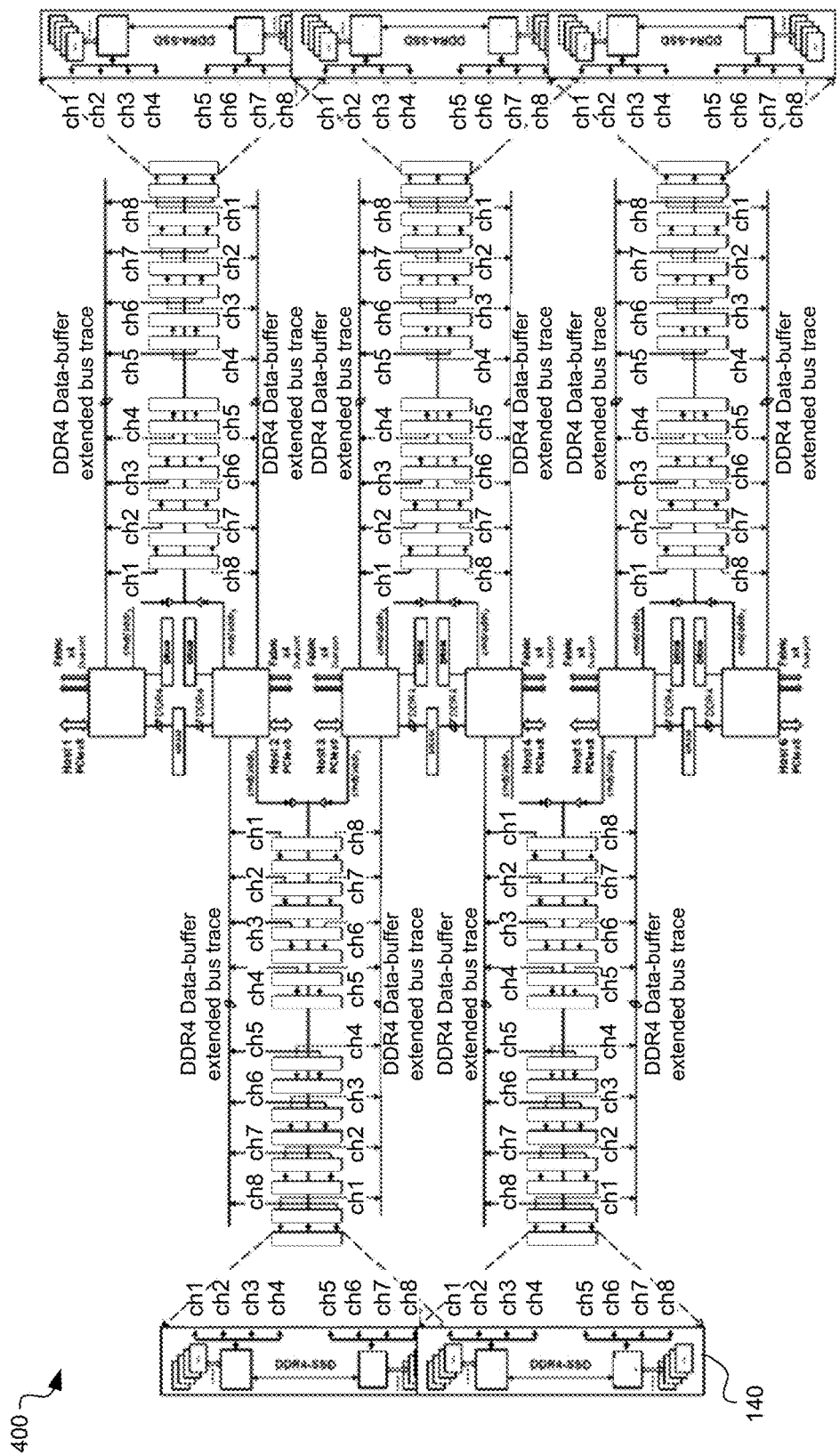
FIG. 4 is a schematic illustration of a network storage node topology for a network storage system, in accordance with an embodiment of the present disclosure.

Referring now to FIG. 4, a network storage node topology 400 for a network storage system is depicted in accordance with an embodiment of the present disclosure. A plurality of network storage nodes 100, interconnected via fabric ports 120, provide redundant data paths and data copies and preserve data integrity against individual component failures.

Each network storage node 100 depicts 2 processors 110 (e.g., 2 FPGAs), which share access to flash memory modules 140 (e.g., DDR4-SSD DIMMs) of the network storage node 100. According to an embodiment, each FPGA 110 is also connected to flash memory modules 140 of another (separate) network storage node. The network storage node topology 400 includes a daisy chain topology, where each processor 110 is connected to all flash memory modules 140 of two distinct network storage nodes. Due to the daisy chain topology, for 'S' network storage nodes, there are 'S+1' processors 110.

For certain board sizes, more processors 110 may be possible. For example, a high-reliability, lower total capacity network storage node 100 could equate to more processors 110, but fewer flash memory modules 140(DDR4-SSD). While a daisy chain topology is depicted, other topologies are consistent with the spirit and scope of the present disclosure.

Figure 5:
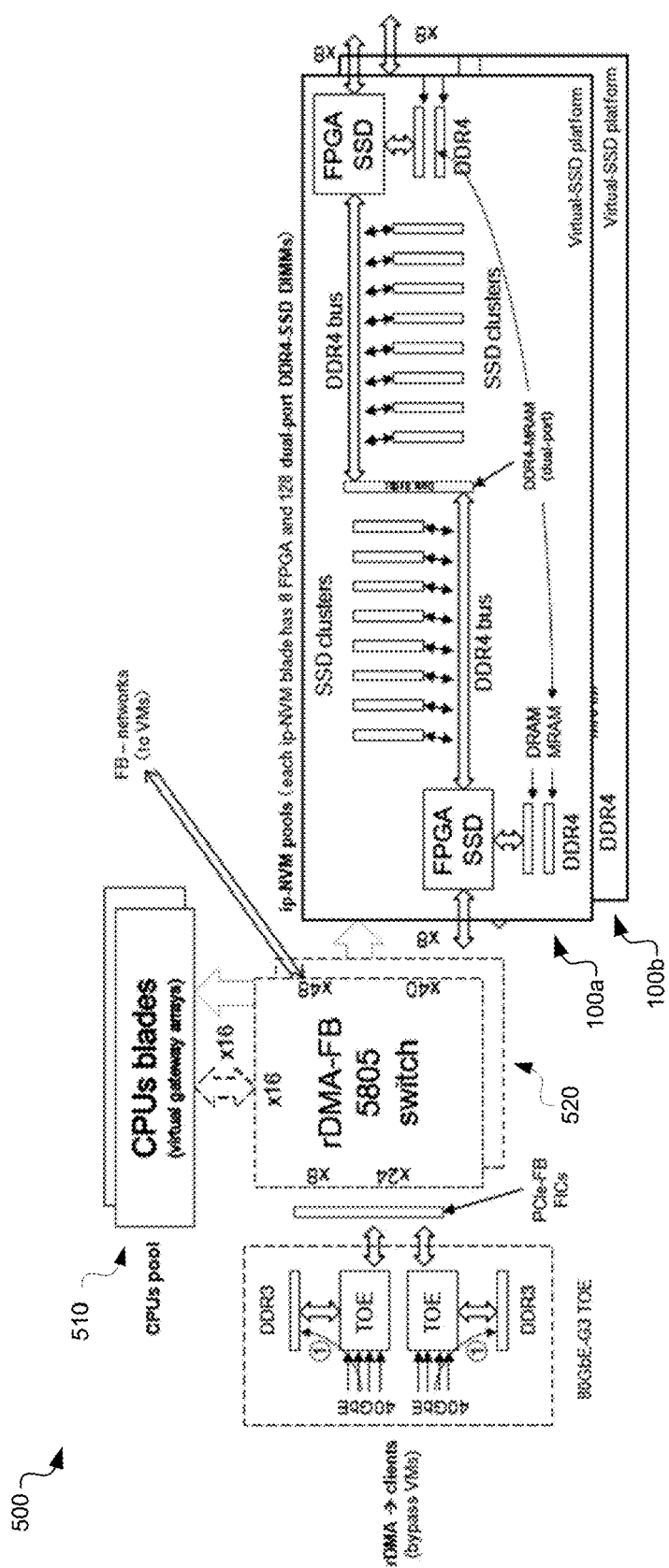
FIG. 5 is a schematic illustration of a virtualized network storage system, in accordance with an embodiment of the present disclosure.

Referring now to FIG. 5, a virtualized network storage system 500 is depicted in accordance with an embodiment of the present disclosure. Virtualized network storage system 500 includes a pool of processors 510 (e.g., host processors 210) and an RDMA-fabric 520, and network storage nodes 100a and 100b. As shown in FIG. 5, the network storage nodes 100a and 100b are interconnected by 2 sets of RDMA-fabric 520, providing communication with remote processor pool 510 (as well as virtual machines). The network storage nodes 100a and 100b each set up as RDMA-master and slave memory, providing virtualization for respective DRAM (e.g., DDR4-DRAMs (x4 32GB)) and MRAM (e.g., DDR4-MRAM (64MB)) for direct access by remote processor pool 510, via RDMA-fabric 520.

According to an embodiment, each network storage nodes 100a and 100b has (8) processors 110 and (128) NVM modules 140 (e.g., dual-port DDR4-SSD DIMMs). Optionally, (6) gateway hosts can be added with (5) PCIe-3.0 x8 ports per host processor of the processor pool 510, (2) PCIe for 80GbE TCP/IP offload Engine (TOE), (3) PCIe for network storage nodes 100a and 100b, with a total of eighteen (18) network storage node clusters. Each network storage nodes can provide PCIe peer-to-peer DMA among 5 input/output devices, without requiring hopping through host device memory. Network storage nodes can also be setup for operation in a distributed file system, and each network storage nodes virtualizes the flash memory storage modules 140 as 1 OSD (Object-Storage-Device).

Figure 6:
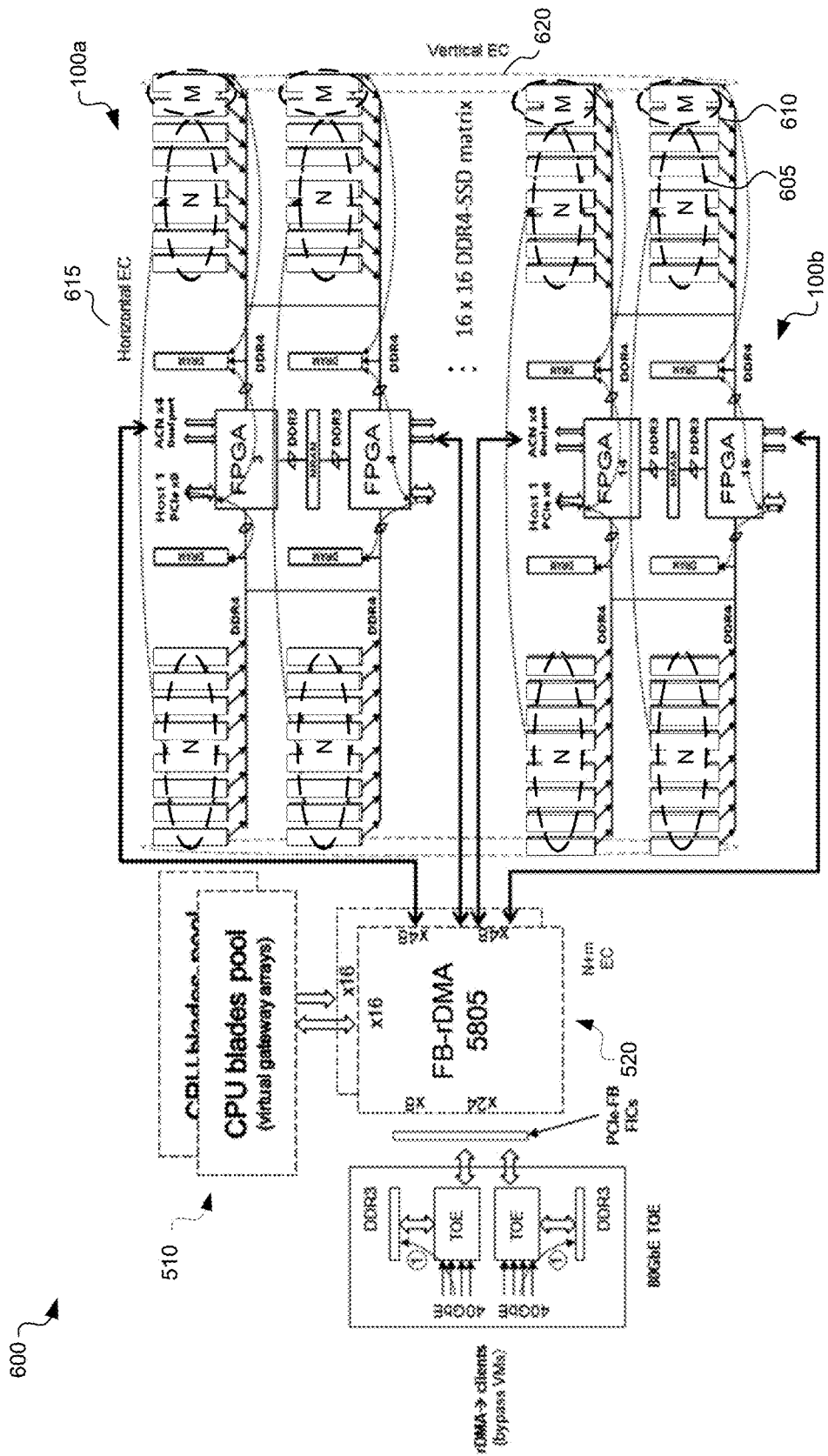
FIG. 6 is a schematic illustration of erasure coding control for a network storage system, in accordance with an embodiment of the present disclosure.

Referring now to FIG. 6, erasure coding control for a network storage system 600 is depicted, in accordance with an embodiment of the present disclosure. Virtualized network storage system 600 includes a pool of processors 510 (e.g., host processors 210) and an RDMA-fabric 520 (e.g., Huawei FB580x), and network storage nodes 100a and 100b.

According to an embodiment of the present disclosure, a flexible two-dimensional erasure code includes N+M coding, referenced by numerals 605 and 610, respectively. The magnitude of N is related to the number of flash memory storage modules 140 in network storage nodes 100. For example, for sixteen (16) flash memory DIMMs on a network storage node 100, 'N' may be equal to 14, depending on the amount of redundancy in the error coding. 'M' refers to a redundancy factor for error coding—larger values of M provide greater redundancy.

According to an exemplary scheme, for a network storage node 100 having sixteen (16) flash memory modules 140, 14+2 error coding is employed. According to another exemplary scheme, for a network storage node 100 having thirty-two (32) flash memory modules 140—and considering that with compression, virtual memory may be greater than 32—32+2 error coding can be employed. In general, N+M erasure coding is applied horizontally 615 or vertically 620, to protect processor 110/memory module 140/network storage node 100 failures. In cases where a single network storage node 100 is managing many services, having only one dedicated failover node might not offer sufficient redundancy. In such cases, more than one (M) standby network storage nodes 100 are included and available. The number of standby network storage nodes 100 is configurable, and is a tradeoff between cost and reliability requirements.

An exemplary embodiment includes two (8) network storage nodes 100, each having two (2) processors 110, totaling sixteen (16) processors 110. Likewise, the can be sixteen (16) memory modules 140 present on each storage node 100. The 16×16 matrix of processors 110 and flash memory modules 140 can be protected by both horizontal 615 15+2 error control, and vertical 620 15+2 error control. By data-compression, 14+2 (N+M) devices can squeeze in 15+3 data and parity blocks for NAND chip failures, DDR4-SSD DIMM failures, and RDMA SSD cluster node failures. The auto-mirroring ops cross fabric network 201 can be part of progressive XOR parity computations for fewer XOR ops and decreased buffer space at a single node. For example, 16 nodes having 8 mirroring pairs for 8 partial parities, then 4 pairs for 4 partial parities, and so on to obtain final parities.

If both processors 110 of a network storage node 100 fail, even with dual-port fabric 120 connection, data recovery could be problematic. However, using an N+2 and N+3 error coding scheme, recovery can still be made vertically (that is, to a separate network storage node 100 of network storage system 200). In general, recovery scheme is flexible with architectures of the present disclosure. Advantageously, cross-node processor 110 reliability is provided by flexible erasure coding described herein.

Figure 7:
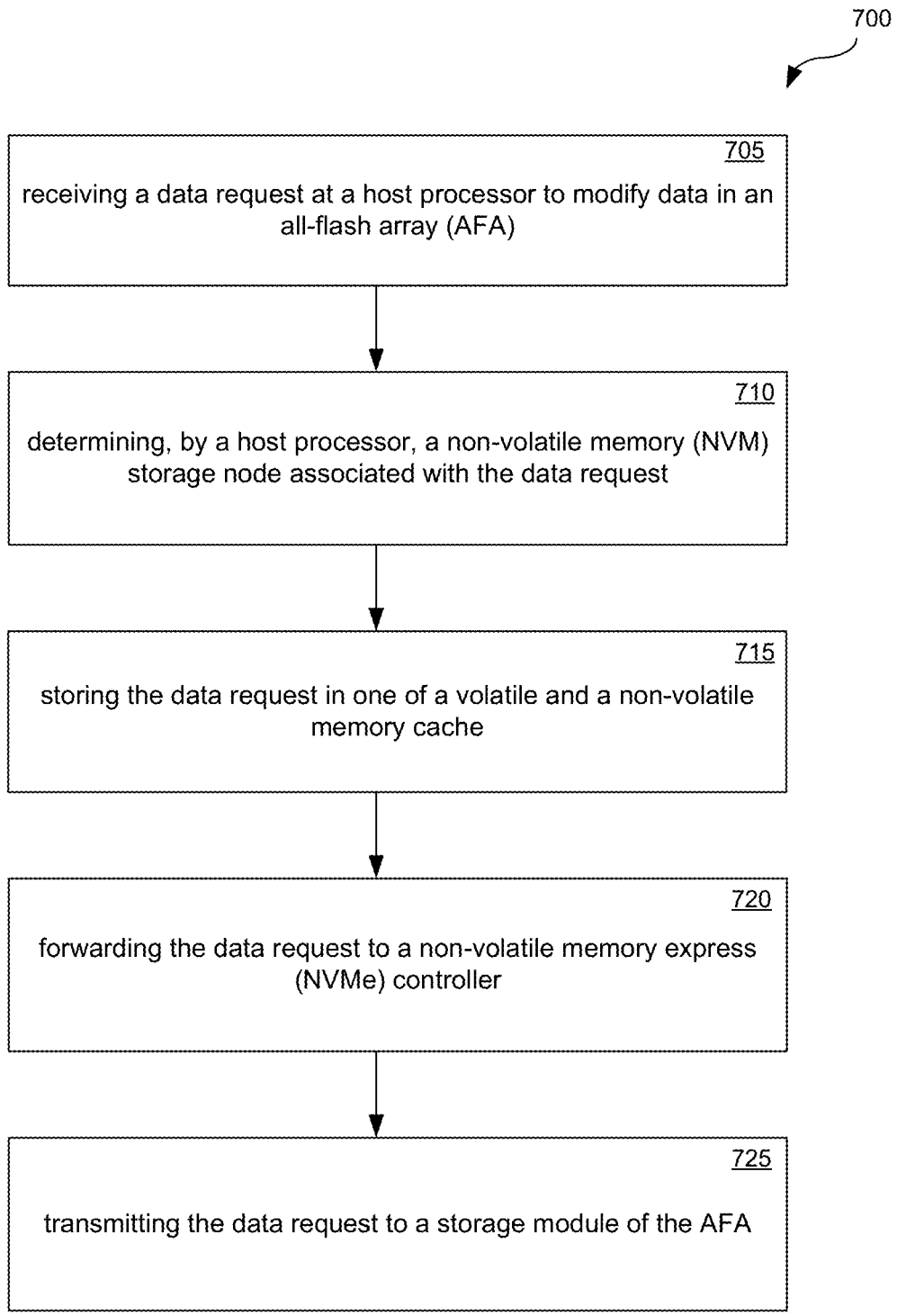
FIG. 7 is a flowchart illustrating an exemplary process for performing a data access request in an all-flash array network storage system, in accordance with an embodiment of the present disclosure.

Referring now to FIG. 7, a flowchart 700 illustrates an exemplary process for performing a data access request in an all-flash array network storage system. Steps 705-725 describe exemplary steps comprising the process depicted in flowchart 700 in accordance with the various embodiments herein described. In one embodiment, the flowchart 700 is implemented as programmed instructions stored in a computer-readable medium and performed by a computing device executing a process for data access in a storage network environment.

The process begins at step 705, receiving a data request through 40GbE or 56G-FC 205 at a host processor (e.g., one of host processors 210) of a distributed data storage network to modify data in an all-flash array (AFA) of the distributed data storage network. The data storage network can include a number of network storage nodes. The data request can be for reading or writing data. At step 710 a determination is made by the host processor 210 of a non-volatile memory (NVM) storage node (e.g., storage node 100) of the distributed data network associated with the data request. The writing data is peer-to-peer DMA-writing to one of the two attached RDMA-SSD blades by the 40GbE or 56G-FC 205, the reading data is upon the metadata or object-key mapped to a related RDMA-SSD blade (attached or fabric linked).

At step 715 the writing data is stored in one of a volatile and a non-volatile memory cache of the NVM storage node. The volatile memory cache can be, for example, a DRAM cache. According to an embodiment, the DRAM cache can connect via a separate DDR4 bus to an NVME controller in 110. The non-volatile memory cache can be an MRAM cache, which can be adapted to store data for a configurable period of time to tolerate power or controller failure as data is being written to flash memory chips. The writing data can be made via RDMA, such that the requesting agent (e.g., a client system or a fabric linked host) has direct memory access to the memory cache of the storage node. The DMA write can be provided via the host PCIE interface, or RDMA write via the fabric port (e.g., for a peer device or a client). According to an embodiment of the present disclosure, the writing data is initially stored in the DRAM and in the relatively slower MRAM, at substantially the same time, to provide a persistent copy of the data request.

At step 720 the writing data is saved in write cache MRAM and placed in NVME cmd queues of the RDMA-SSD storage node. According to an embodiment, the processor of the controller 110 (e.g., an FPGA) communicates to the requesting agent that a write data request has been completed subsequent to storage of the data request in the MRAM.

At step 725 the writing data request is queued, then directed to a storage module (e.g., DDR4-SSD DIMM) of the AFA. For a data write to a flash page in a DDR4-SSD DIMM unit, the data is written through a DDR4-8 bit channel (1 byte of DDR4-64 bit bus 125) and an 8 bit control bus of cmd/address/queues to the storage module 140, as ONFI-over-DDR4. The ONFI cmd/address are carried by the 8 bit control bus and the ONFI data flows are synchronously carried by the DDR4-8 bit channel in 1KB burst transfers, separately. Sixteen (16) concurrent write or read transfers can be carried by the 8 DDR4-8 bit channels by one controller, and the 8 DDR4-8 bit channels of another controller provide simultaneous accesses of the 16 dual-port DDR4-SSD DIMM units, for higher than 95% bus utilization of unified memory bus 125 with modified DDR4 cmd/address bus (two 8 bit control buses).

For a flash read request, the NVME cmd queues are sorted to one of the 16 DDR4-SSD DIMM units according to the BTL and FTL tables in the host software and ARM64 firmware. The associated read cmd queues can be mixed within the write cmd/address flows. The ARM64 firmware is able to poll the status registers on the DDR4-SSD DIMM. As one read data buffer on the DIMM 140 is ready, the on-going write burst transfer (accumulating toward 16KB page) can be interrupted, then initiation can be made of the read burst (512 B or 1KB toward 4KB or 1MB according the read cache buffers) accesses from the storage module 140, and written to the read cache DRAM of the same storage node. At the DRAM the data can be accessed by the client. In a state where the BTL reflects the read data is in the read cache buffer, there is no need to read from DDR4-SSD DIMM unit, such that host and ARM64 firmware are processing the BTL first, then FTL after read cache-miss.

According to an embodiment, a client on the fabric network within the Data Center Network infrastructure enables the RDMA write engine to be setup by the host to RDMA write transfer the read data buffers to the remote client. Otherwise, the host NVME drive is able to poll the RDMA-SSD status and to trigger the DMA read at the 40GbE port or 56G-FC port. Further, for a host that has already prepared the DMA read chains with the virtual cache buffers, the RDMA-SSD controller can also trigger this DMA transfer.

According to an embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be database servers, storage devices, desktop computer systems, portable computer systems, handheld devices, networking devices or any other device that incorporates hard-wired and/or program logic to implement the techniques.

In the foregoing detailed description of embodiments of the present invention, numerous specific details have been set forth in order to provide a thorough understanding of the present invention. However, it will be recognized by one of ordinary skill in the art that the present invention is able to be practiced without these specific details. In other instances, well-known methods, procedures, components, and circuits have not been described in detail so as not to unnecessarily obscure aspects of the embodiments of the present invention. Although a method is able to be depicted as a sequence of numbered steps for clarity, the numbering does not necessarily dictate the order of the steps. It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part.

Embodiments according to the present disclosure are thus described. While the present disclosure has been described in particular embodiments, it is intended that the invention shall be limited only to the extent required by the appended claims and the rules and principles of applicable law.

What is claimed is:

1. A non-volatile memory express (NVME) controller comprising:
   two host interfaces separate from each other, with one of the two host interfaces configured for communications with a host processor and the other one of the two host interfaces configured for communications with another host processor;
   a dual port fabric port configured for peer communication;
   a dual port unified memory interface configured for communication with dynamic memories and nondeterministic persistent memories and a plurality of dual-port non-volatile storage modules;
   a memory cache comprising a first volatile memory, a second volatile memory, and a non-volatile memory with the non-volatile memory being physically distinct and separate from the first and second volatile memories, and the first and second volatile memories being physically distinct and separate from each other; and
   two processors communicatively coupled with the two host interfaces, the dual port fabric port, the unified memory interface, and the memory cache, with one of the two processors coupled to the first volatile memory via a first bus and the other one of the two processors coupled to the second volatile memory via a second bus, the two processors coupled to the non-volatile memory with the non-volatile memory dedicated and coupled to each of the two processors separate from the first and second buses coupling the two processors to the first and second volatile memories, the two processors configured to store data in the memory cache, shared by the two processors, in response to a data request received at one of the dual port fabric port and one of the two host interfaces, the first and second volatile memories arranged for read caching and the non-volatile memory arranged for write caching to provide a copy of the data while the data is being prepared for storage in a primary storage and for metadata caching, and the two processors configured to determine a non-volatile storage module of a dual-port all-flash array (AFA) for the data associated with the data request, the non-volatile storage module in communication with the unified memory interface and associated with the data request, wherein each processor of the two processors has independent control of the plurality of dual-port non-volatile storage modules;
   wherein the NVME controller is operable as part of a NVME storage node to allow a remote data memory access (RDMA) write into the memory cache from other NVME storage nodes, including using N+M error coding, where M is a positive integer that is a redundancy factor for the N+M error coding and N+M equals a total number of non-volatile storage modules of the dual-port AFA associated with one or both of the two processors.

2. The NVME controller according to claim 1, wherein each of the two processors is configured to communicate, after a data block is cached in the non-volatile memory, that the data request being a write request is completed and committed and then store the data block to be written to the non-volatile storage module later on.

3. The NVME controller according to claim 1, wherein the data stored in response to the data request is stored in the first volatile memory or the second volatile memory via remote direct memory access.

4. The NVME controller according to claim 3, wherein the data stored in the first volatile memory or the second volatile memory is also cached into the non-volatile memory for a configurable, given period of time.

5. The NVME controller according to claim 1, wherein the data comprises a header and a payload, and wherein the header is forwarded on the first bus to the first volatile memory or on the second bus to the second volatile memory and the payload is forwarded on a third bus to the non-volatile storage module.

6. The NVME controller according to claim 1, further comprising a plurality of dual port fabric ports communicatively coupled to a respective plurality of NVME controllers, accessible by multiple pairs of hosts.

7. The NVME controller according to claim 1, further comprising more than two processors and more than two host interfaces.

8. A non-volatile memory express (NVME) storage node comprising:
   two host processors;
   a switch fabric;
   a dual-port non-volatile storage all-flash array module (AFA DIMM); and
   a NVME controller, comprising:
      two host interfaces communicatively coupled to other two host processors in different nodes;
      a dual port switch fabric port communicatively coupled to the switch fabric;
      a unified memory interface communicatively coupled to the dual-port non-volatile storage all-flash array module;

a memory cache having volatile memory for reads and non-volatile memory for writes and metadata, the volatile memory being physically distinct and separate from the non-volatile memory; and a processor communicatively coupled with the two host interfaces, the dual port switch fabric port, the unified memory interface and the memory cache, the processor configured to store data in the memory cache in response to a data request received at one of the dual port fabric port and one of the two host interfaces, the volatile memory of the memory cache arranged for read caching via a bus coupled to the processor and the non-volatile memory of the memory cache arranged for write caching to provide a copy of the data while the data is being prepared for storage in a primary storage and for metadata caching, the non-volatile memory of the memory cache dedicated and coupled to each of the processor and another processor of the NVME controller, the non-volatile memory coupled separate from the bus coupling the volatile memory to the processor, and the processor to subsequently modify the data in the dual-port non-volatile storage all-flash array module (AFA DIMM) according to the request;

wherein the NVME storage node is operable to allow a remote data memory access (RDMA) write into the memory cache from other NVME storage nodes, including using N+M error coding, where M is a positive integer that is a redundancy factor for the N+M error coding and N+M equals a total number of AFA DIMMs of the NVME storage node associated with the processor.

9. The NVME storage node according to claim 8, wherein the volatile memory comprises dynamic random-access memory (DRAM) and the non-volatile memory comprises magnetoresistive random-access memory (MRAM).

10. The NVME storage node according to claim 9, wherein a unified memory bus comprises a first data bus in communication with the DRAM, and a second data bus in communication with the dual-port non-volatile storage all-flash array module.

11. The NVME storage node according to claim 8, wherein a plurality of dual port all-flash array (AFA) non-volatile storage modules in DIMM form factor comprises the dual port non-volatile storage all-flash array module (AFA DIMM).

12. The NVME storage node according to claim 11 comprising at least two host processors and at least two NVME controllers, wherein the data request received at a first NVME controller of the at least two NVME controllers is copied and forwarded to a second memory cache of the second NVME controller of the at least two NVME controllers, and the at least two host processors can access any of a plurality of dual port non-volatile storage all-flash array modules.

13. The NVME storage node of claim 8, wherein the unified memory interface comprises a 64bit DDR4 bus split into 8bit DDR4-ONFI channels.

14. The NVME storage node according to claim 8, wherein the non-volatile memory express (NVME) storage node is based on dual-port fabric and plurality of dual-port storage modules AFA DIMM devices that not only provide a redundant secondary data access path but also double the data throughput as needed by applications, as flash storages over dual-port DDR memory channels.

15. A method for directing a data request to an all-flash array (AFA), the method comprising:

receiving a data request at a host processor to modify data in an all-flash array (AFA);

determining, by the host processor, a non-volatile memory (NVM) storage node associated with the data request;

storing the data in a memory cache having a volatile memory and a non-volatile memory, such that the volatile memory of the memory cache is arranged for read caching the data coupled via a bus and the non-volatile memory of the memory cache is arranged for write caching to provide a copy of the data while the data is being prepared for storage in a primary storage, the non-volatile memory of the memory cache dedicated and coupled to each of a first processor and a second processor of a non-volatile memory express (NVME) controller on which the memory cache is disposed, the non-volatile memory coupled separate from the bus coupling the volatile memory to the processor, the non-volatile memory coupled to cache the data;

forwarding the data request to the NVME controller;

transmitting the data request to a storage module of the AFA through a memory control bus shared by multiple dual-port AFA DIMM devices; then writing the data as data blocks into each AFA DIMM device through eight of an eight-bit DDR4 data sub-channels for parallel block writes, or fetching the data as data blocks from each AFA DIMM device by the controller as parallel block reads; and allowing a remote data memory access (RDMA) write into the memory cache from other NVM storage nodes, including using N+M error coding, where M is a positive integer that is a redundancy factor for error coding and N+M equals a total number of dual-port AFA DIMM devices associated with the first processor or the second processor.

16. The method of claim 15, wherein the storing the data includes buffering a data block that comprises a remote data memory access (RDMA) by an agent generating the data block in the non-volatile memory of the memory cache for writes then the NVME controller direct memory access (DMA) writing this data block into one of storage AFA DIMM at a later time.

17. The method of claim 15, wherein the data request comprises a read request, and the data request is assigned to one of the dual-port AFA DIMM devices for block read operations; then this data block is buffered in a dynamic random-access memory (DRAM) cache for local host or remote data memory access (RDMA) hosts.

18. The method of claim 17, wherein the data request is stored in the DRAM cache for a configurable, given time period, for future cache-hit reads without accessing flash storages.

19. The method of claim 15, wherein the data request is a write request, and the data request is stored in a magnetoresistive random-access memory (MRAM) cache.

20. The method of claim 19, wherein the data request is initially stored in a DRAM cache.

21. The method according to claim 15, wherein the NVME controller is in communication with a second NVME controller of a second NVM storage node of a distributed data network, and wherein the data is stored in one of a volatile and a non-volatile memory cache of the second NVM storage node.

22. A non-volatile memory express (NVME) storage node comprising:

a host processor;

a switch fabric;
a dual-port non-volatile storage all-flash array module (AFA DIMM); and
a NVME controller comprising:
  a host interface communicatively coupled to the host processor;
  a dual port switch fabric port communicatively coupled to the switch fabric;
  a unified memory interface communicatively coupled to the dual-port on-volatile storage all-flash array module;
  a memory cache having volatile memory for reads and non-volatile memory for writes and metadata; and
  a processor communicatively coupled with the host interface, the dual port switch fabric port, the unified memory interface and the memory cache, the processor configured to store data in the memory cache in response to a data request received at one of the host interface and the dual port fabric port, and to subsequently modify the data in the dual-port non-volatile storage all-flash array module (AFA DIMM) according to the request, wherein the NVME storage node is in communications with other available NVME storage nodes to allow the other available NVME storage nodes to remote data memory access (RDMA) write suitable data blocks or parity blocks into DRAM buffers of the NVME storage node, in order to recover a lost data block or failed to read from the NVME storage node; wherein with a number of redundant parity blocks being variable m and a number of protected data blocks being N, N+m is selected to be less than a total number of the dual-port AFA DIMM devices distributed within all the NVME storage nodes.

* * * * *